(12) United States Patent
Cho et al.

(10) Patent No.: US 7,471,228 B2
(45) Date of Patent: *Dec. 30, 2008

(54) SHARING OPERATIONAL AMPLIFIER BETWEEN TWO STAGES OF PIPELINED ADC AND/OR TWO CHANNELS OF SIGNAL PROCESSING CIRCUITRY

(75) Inventors: Taehee Cho, Irvine, CA (US); Sandor L. Barna, Pasadena, CA (US); Andrew M. Lever, Surrey (GB); Kwang-Bo Cho, Los Angeles, CA (US); Chiajen Lee, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/604,901

(22) Filed: Nov. 28, 2006

(65) Prior Publication Data
US 2007/0090987 A1  Apr. 26, 2007

Related U.S. Application Data

(63) Continuation of application No. 11/211,566, filed on Aug. 26, 2005, now Pat. No. 7,148,833.

(51) Int. Cl.
   *H03M 1/42*  (2006.01)
(52) U.S. Cl. .................. 341/162; 341/161; 348/308
(58) Field of Classification Search .......... 341/161, 341/162, 163; 348/308
   See application file for complete search history.

(56) References Cited

U.S. PATENT DOCUMENTS 5,764,176 A  6/1998  Ginetti
6,133,864 A * 10/2000 Sabatini ............... 341/141
6,437,608 B1  8/2002 Miyabe et al.
6,469,652 B1  10/2002 Aude
6,784,824 B1 * 8/2004 Quinn ................. 341/172
6,870,495 B1  3/2005 Zadeh et al.
6,946,987 B1  9/2005 Van Blerkom et al.
6,954,169 B1  10/2005 Min
6,956,519 B1  10/2005 Huang et al.
6,965,258 B2  11/2005 Bogner
7,106,240 B2 * 9/2006 Cringean ............. 341/163
2005/0140537 A1  6/2005 Waltari
2006/0044172 A1  3/2006 Sasaki et al.
2006/0125674 A1 * 6/2006 Tadeparthy et al. ....... 341/155
2006/0187329 A1 * 8/2006 Panicacci ................. 348/308

OTHER PUBLICATIONS

Ray et al.; A Low Power 10 bit 80 MSPS Pipelined ADC in Digital CMOS Process; IEEE 2002 45th Midwest Sysmposium on Circuits and Systems; Aug. 2002; pp. 579-582.*

(Continued)

*Primary Examiner*—Howard Williams
(74) *Attorney, Agent, or Firm*—Dickstein Shapiro LLP

(57) ABSTRACT

A mechanism for discharging parasitic capacitance at an input of an operational amplifier, which is shared between two stages of a pipelined analog-to-digital converter and/or two channels of signal processing circuitry, before the amplifier configuration of the stages/channels is switched. The discharging act occurs when a short reset pulse is generated between two clock phases. The short reset pulse is applied to a switch connected to the operational amplifier input. When the reset pulse closes the switch, a discharge path is created and any parasitic capacitance at the operational amplifier input is discharged through the path. The discharging of the parasitic capacitance substantially mitigates the memory effect and the problems associated with the memory effect.

16 Claims, 12 Drawing Sheets

OTHER PUBLICATIONS

Nagaraj, K. et al. A 250-mW, *-b, 52-Msamples/s Parallel-Pipelined A/D Converter with Reduced Number of Amplifiers; IEEE Jorunal of Solid State Circuits, vol. 32, No. 3, Mar. 1997; pp. 312-320.*

K. Nagaraj, et al., "A 250-mW, 8-b, 52-Msamples/s Parallel-Pipelined A/D Converter with Reduced Number of Amplifiers," IEEE Journal of Solid-State Circuits, vol. 32, No. 3, Mar. 1997.

B. Min, et al., "A 69-mW 10-bit 80-MSample/s Pipelined CMOS ADC," IEEE Journal of Solid-State Circuits, vol. 38, No. 12, Dec. 2003.

Byung-Moo Min et al., A 69-mW 10-bit 80-MSample/s Pipelined CMOS ADC, IEEE Journal of Solid-State Circuits, Dec. 2003, vol. 38, Issue: 12, pp. 2031-2039.

* cited by examiner

SHARING OPERATIONAL AMPLIFIER BETWEEN TWO STAGES OF PIPELINED ADC AND/OR TWO CHANNELS OF SIGNAL PROCESSING CIRCUITRY

This application is a continuation of application Ser. No. 11/211,566, filed Aug. 26, 2005, now U.S. Pat. No. 7,148,833, which is hereby incorporated by reference in its entirety.

FIELD OF THE INVENTION

The present invention relates to pipelined analog-to-digital converters that share operational amplifiers between two stages of the pipeline and signal processing circuitry that shares an operational amplifier between two signal processing channels.

BACKGROUND OF THE INVENTION

Analog-to-digital converters (ADCs) are useful components in any circuit or system that interfaces analog and digital circuitry and signals. One application in which analog-to-digital converters are particularly useful includes imaging devices such as CMOS and CCD imagers. Imagers typically convert light photons into analog image signals. These analog image signals are converted to digital signals, by an analog-to-digital converter, and then processed by an image processor or other processing circuitry.

There is a desire to increase the speed of the analog-to-digital conversion process in many applications such as e.g., imagers. As such, many applications use pipelined analog-to-digital converters, which typically operate faster than non-pipelined analog-to-digital converters. FIG. 1 is an illustration of a conventional N-bit pipelined analog-to-digital converter 10. The pipelined analog-to-digital converter 10 consists of multiple low resolution (e.g., 1.5 bits) stages $12_1$, $12_2$, ..., $12_n$, ... $12_{N-1}$, each of which comprises an arithmetic unit 20 and a two-level decision circuit 40. The pipelined analog-to-digital converter 10 further includes digital correction logic 14 for outputting an N-bit digital code representing an input analog signal.

FIG. 1 illustrates the components of the nth stage $12_n$ in more detail. It should be appreciated that the other stages $12_1$, $12_2$, ..., $12_{N-1}$ contain the same circuitry as the nth stage $12_n$. The arithmetic unit 20 comprises a switching block 22, four additional switches 24, 26, 28, 30, a sampling capacitor Cs, a feedback capacitor Cf, and an operational amplifier 32. The decision circuit 40 includes two comparators 42, 44 and an encoder 46.

In operation, the arithmetic unit 20 in the first stage $12_1$ merely operates as a sample and hold circuit. In the other stages $12_2$, ..., $12_n$, ... $12_{N-1}$, the arithmetic unit 20 multiplies the incoming analog signal portion $V_{RES(n-1)}$, often referred to as a "residue," by a factor of two and subtracts from this product one of three voltages $+V_R$, 0, $-V_R$, based on the closed switch in the switching block 22. The switches of block 22 are opened/closed based on the decision bits $D_{n-1}$ from a prior stage (e.g., stage $12_{n-1}$). The new residue is fed into the decision circuit 40, where it is compared with two different reference voltages $\frac{1}{4}V_R$, $-\frac{1}{4}V_R$. The encoder generates and outputs decision bits $D_n$ for the stage $12_n$. The decision bits for each of the stages $12_1$, $12_2$, ..., $12_n$, ... $12_{N-1}$ are processed by the digital correction logic 14, which removes any redundancy and outputs the N-bit digital output code.

As can be seen in FIG. 1, the conventional pipelined analog-to-digital converter 10 requires one operational amplifier 32 for each stage $12_1$, $12_2$, ..., $12_n$, ... $12_{N-1}$ in the pipeline. The majority of the power of the pipelined analog-to-digital converter 10 is consumed by operational amplifiers 32. Therefore, minimizing the power consumption of the operational amplifiers 32 is key to the design of low power pipelined analog-to-digital converters 10.

FIG. 2 illustrates the timing diagram for two stages STAGE 1, STAGE 2 of the FIG. 1 pipelined analog-to-digital converter 10. Non-overlapping clock signals PHI1, PHI2 are used to control the switching circuitry contained within each stage STAGE 1, STAGE 2 to configure how the sampling and feedback capacitors Cs, Cf and the operational amplifier 32 are connected.

FIG. 3 illustrates the operational amplifier configuration of the two stages STAGE 1, STAGE 2 when the second clock signal PHI2 is asserted (i.e., has a high level). As can be seen in FIGS. 2 and 3, the first stage STAGE 1 undergoes a sampling operation while the second stage STAGE 2 undergoes an amplifying operation. That is, the first stage's arithmetic unit $20_1$ is configured such the analog input voltage Vin is sampled in the sampling capacitor Cs. The second stage's arithmetic unit $20_2$ is configured in a manner such that the operational amplifier 32 amplifies the signal stored in the sampling capacitor Cs and outputs the amplified signal as Vout.

FIG. 4 illustrates the operational amplifier configuration of the two stages STAGE 1, STAGE 2 when the first clock signal PHI1 is asserted (i.e., has a high level). As can be seen in FIGS. 2 and 4, the first stage STAGE 1 undergoes the amplifying operation while the second stage STAGE 2 undergoes the sampling operation. That is, the first stage's arithmetic unit $20_1$ is configured such the signal stored in the sampling capacitor Cs is amplified by the operational amplifier 32. The second stage's arithmetic unit $20_2$ is configured to sample the output from the first stage STAGE 1 and store it in the stage 2 STAGE 2 sampling capacitor Cs.

It can be seen from FIGS. 3 and 4 that during the sampling operations, the operational amplifiers 32 performs no useful function; they just consume power. This occurs because the operational amplifiers 32 are placed into an open-loop configuration with their inputs and outputs connected to known voltage levels. To avoid wasting power during every sampling operation, some analog-to-digital converters share one operational amplifier 32 between two adjacent stages STAGE 1, STAGE 2 as us shown in FIGS. 5 and 6.

FIGS. 5 and 6 illustrate a circuit 120 of a pipelined analog-to-digital converter in which arithmetic units $20_1$, $20_2$ of two pipeline stages STAGE 1, STAGE 2 share one operational amplifier 32. The amplifier 32 can be shared because the circuit 120 contains six switches S1, S2, S3, S4, S5, S6 that are controlled to connect the sampling and feedback capacitors Cs, Cf to the operational amplifier 32 inputs and outputs differently depending on the operation being performed.

FIG. 5 illustrates the circuit 120 when the second clock signal PHI2 of FIG. 2 is asserted. While the second clock signal PHI2 is asserted, switch S1 is closed to connect the analog input voltage Vin to the stage 1 arithmetic unit $20_1$ sampling capacitor Cs. Switches S5 and S6 are closed in the second stage's arithmetic unit $20_2$ such that the operational amplifier 32 amplifies, and outputs as Vout, a signal stored in the stage 2 arithmetic unit $20_2$ sampling capacitor Cs. The other switches S2, S3 and S4 are left open. Thus, as can be seen in FIGS. 2 and 5, the first stage STAGE 1 undergoes a sampling operation while the second stage STAGE 2 undergoes an amplifying operation, but only one operational amplifier 32 is connected and used.

FIG. 6 illustrates the circuit 120 when the first clock signal PHI1 of FIG. 2 is asserted. While the first clock signal PHI1 is asserted, switches S1, S5 and S6 are open, and switches S2, S3 and S4 are closed. As such, the first stage's arithmetic unit $20_1$ is configured such that a signal stored in the first stage arithmetic unit $20_1$ sampling capacitor Cs is amplified by the operational amplifier 32 and output as Vout. The second stage's arithmetic unit $20_2$ is configured to sample and store an analog input Vin in the stage 2 STAGE 2 sampling capacitor Cs. As can be seen in FIGS. 2 and 6, the first stage STAGE 1 undergoes the amplifying operation while the second stage STAGE 2 undergoes the sampling operation. Again, only one operational amplifier 32 is connected and used during these operations.

By sharing an operational amplifier 32 between adjacent two stages STAGE 1, STAGE 2, the power consumption of the pipelined analog-to-digital converter 10 (FIG. 1) can be reduced by half. However due to the finite DC gain Ao and input parasitic capacitance Cp of the operational amplifier 32 (FIG. 7b), the previous output Vo(k-1) adversely effects the present output Vo(k), which is known in the art as the "memory effect." The memory effect can cause a non-linearity in the operational amplifier 32 and thus, analog-to-digital converter output.

Briefly, the memory effect can be described using the following equations in reference to FIG. 7a. Ideally, during sampling, charge should be represented as Q=(Cf+Cs)×Vin. From charge conversion, at the amplifying phase, Q=Cf×(Vo−Vx)−Cp×Vx−Cs×Vx=(Cf+Cs)×Vin, where Vx is the input node voltage of the operational amplifier 32. Because the amplifier has a finite gain Ao, Vo=−Ao×Vx −>Vx=−Vo/Ao. This means that Cf×(Vo+Vo/Ao)+Cp×Vo/Ao+Cs×Vo/Ao=(Cf+Cs)×Vin. Therefore, Vo=Vin×(Cf+Cs)/(Cf+(Cf+Cs+Cp)/Ao), which equals Vin×Gc.

In reality, however, there is charge associated with parasitic capacitance Cp (due to the memory effect). As such, at the sampling stage, as shown in FIG. 7b, Q=(Cf+Cs)×Vin(k)−Cp×Vin_err(k), where Vin_err(k) is the memory error associated with the parasitic capacitance Cp. Using just the error term, from charge conversion, Vo(k)=−Vin_err(k)×Cp/(Cf+(Cf+Cs+Cp)/Ao)~=−Vin_err(k)×Cp/Cf, if Ao is large enough. For the first and second terms Vo(k)=Vin(k)×Gc−Vin_err(k)×Cp/(Cf+(Cf+Cs+Cp)/Ao). Since Vin_err(k) comes from the previous output, Vin_err(k)=−Vo(k−1)/Ao= −Gc×Vin(k−1)/Ao. Accordingly, Vo(k)=Vin(k)×Gc+Vin(k−1)×Gc/Ao×Cp/(Cf+(Cf+Cs+Cp)/Ao)=Vin(k)×Gc+Vin(k−1)×Gc×e, where e=1/Ao×Cp/(Cf+(Cf+Cs+Cp)/Ao)~1/Ao× Cp/Cf. It should be noted that the second order error are neglected in the above calculations.

In addition, charge injection and kickback noise from the circuitry add to the memory effect error described above. Reducing the memory effect is a key element in designing a pipelined analog-to-digital converter that shares operational amplifiers between two pipeline stages. Accordingly, there is a need and desire for a pipelined analog-to-digital converter that shares an operational amplifier between two pipeline stages, yet does not suffer from the memory effect and the problems associated with the memory effect.

It is known to divide signal processing circuitry into multiple channels. For example, imagers often include multiple readout channels where one channel processes a specific set of pixel signals and at least one other channel processes the remaining sets of pixel signals. FIG. 7c illustrates a two channel processing circuit 150 designed to sample and hold analog input signals and convert the signals into digital signals. As shown in FIG. 7c, the first channel CHANNEL 1 comprises a sample and hold circuit $152_a$ and multiple analog-to-digital pipeline stages $154_a$, $156_a$. Similarly, the second channel CHANNEL 2 comprises a sample and hold circuit $152_b$ and multiple analog-to-digital pipeline stages $154_b$, $156_b$. The sample and hold circuits $152_a$, $152_b$ share an operational amplifier 32. The analog-to-digital pipeline stages $154_a$, $154_b$ share an operational amplifier 32 as do the other analog-to-digital pipeline stages $156_a$, $156_b$.

The devices of the two channels CHANNEL 1, CHANNEL 2 share the operational amplifiers in a similar manner and with similar timing (e.g., FIG. 2) as the adjacent pipelined analog-to-digital converter stages share the operational amplifiers (as discussed above). That is, the channels switch in or out the amplifier based on the operation being performed in that portion of the channel. Thus, although the circuit 150 achieves the benefits of reducing the number of operational amplifiers, the circuit 150 also suffers from the memory effect. Accordingly, there is a need and desire for sharing an operational amplifier between two channels of a signal processing circuit, yet does not suffer from the memory effect and the problems associated with the memory effect.

SUMMARY OF THE INVENTION

The invention provides a pipelined analog-to-digital converter that shares an operational amplifier between two pipeline stages, yet does not suffer from the memory effect and the problems associated with the memory effect.

The invention also provides for the sharing of an operational amplifier between two channels of a signal processing circuit, yet does not suffer from the memory effect and the problems associated with the memory effect.

The above and other features and advantages are achieved in various exemplary embodiments of the invention by providing a mechanism for discharging parasitic capacitance at an input of an operational amplifier, which is shared between two stages of a pipelined analog-to-digital converter and/or two channels of signal processing circuitry, before the amplifier configuration of the stages/channels is switched. The discharging act occurs when a short reset pulse is generated between two clock phases. The short reset pulse is applied to a switch connected to the operational amplifier input. When the reset pulse closes the switch, a discharge path is created and any parasitic capacitance at the operational amplifier input is discharged through the path. The discharging of the parasitic capacitance substantially mitigates the memory effect and the problems associated with the memory effect.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
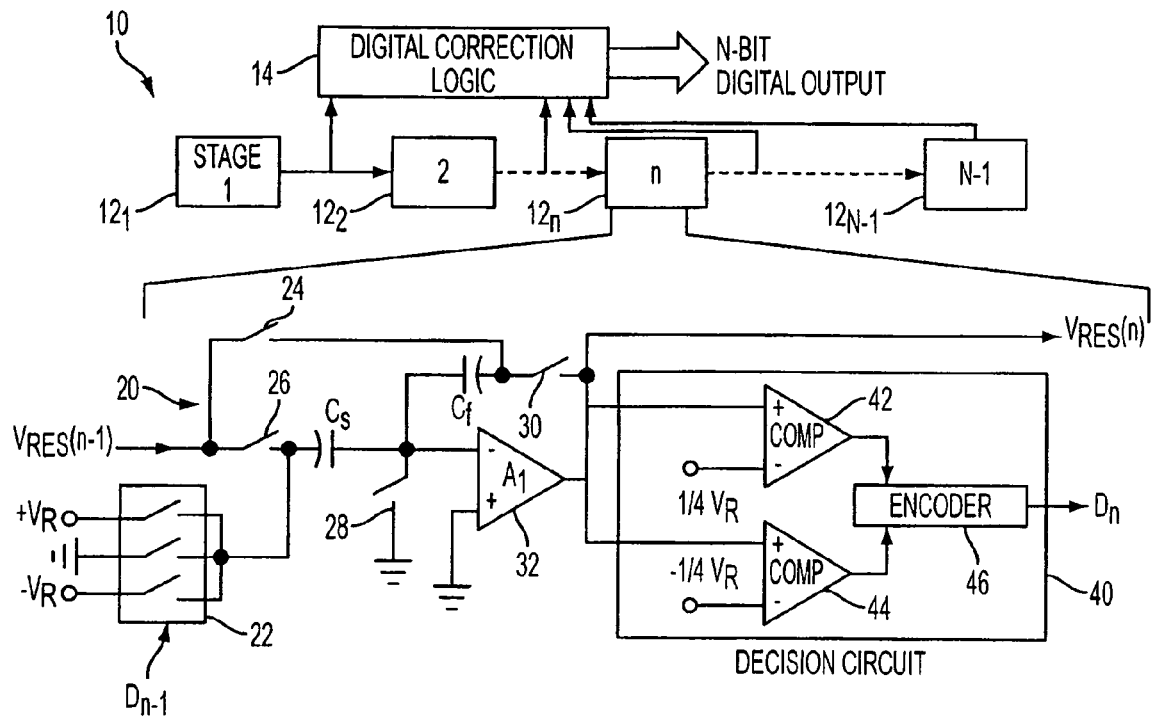
FIG. 1 is an illustration of a conventional N-bit pipelined analog-to-digital converter.
Figure 2:
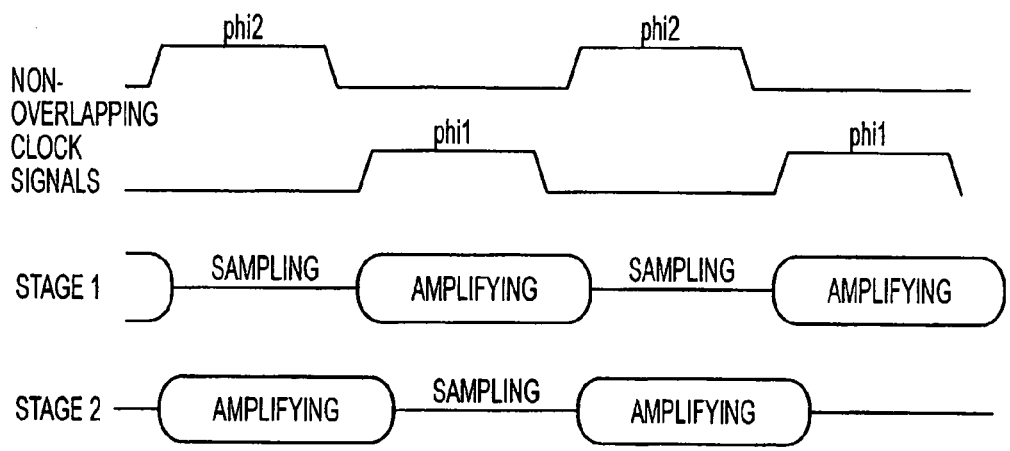
FIG. 2 is a timing diagram for two stages of the FIG. 1 pipelined analog-to-digital converter.
Figure 3:
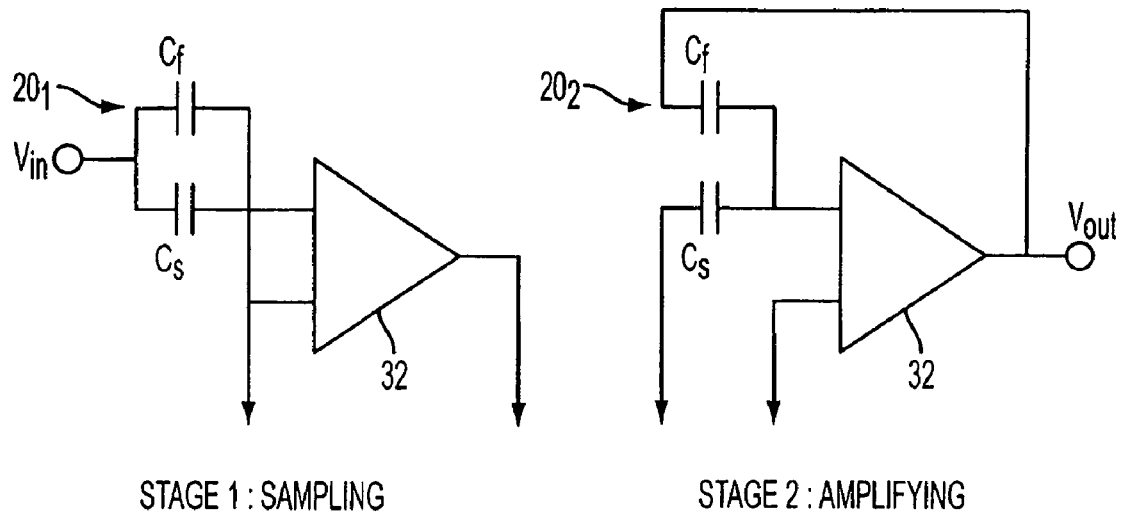
FIG. 3 illustrates the operational amplifier configuration of the two stages of the FIG. 1 pipelined analog-to-digital converter in accordance with one timing of the FIG. 2 timing diagram.
Figure 4:
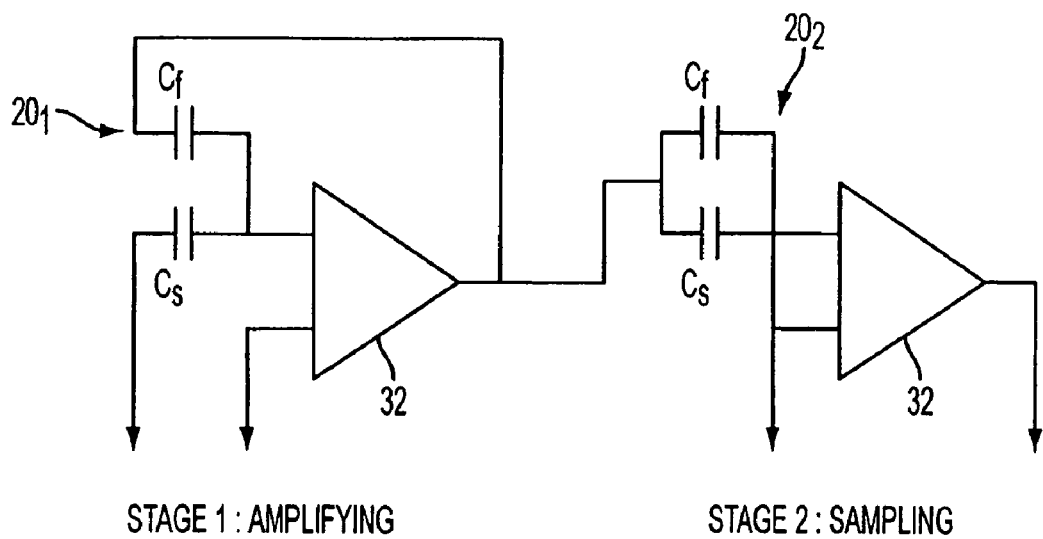
FIG. 4 illustrates the operational amplifier configuration of the two stages of the FIG. 1 pipelined analog-to-digital converter in accordance with a second timing of the FIG. 2 timing diagram.
Figure 6:
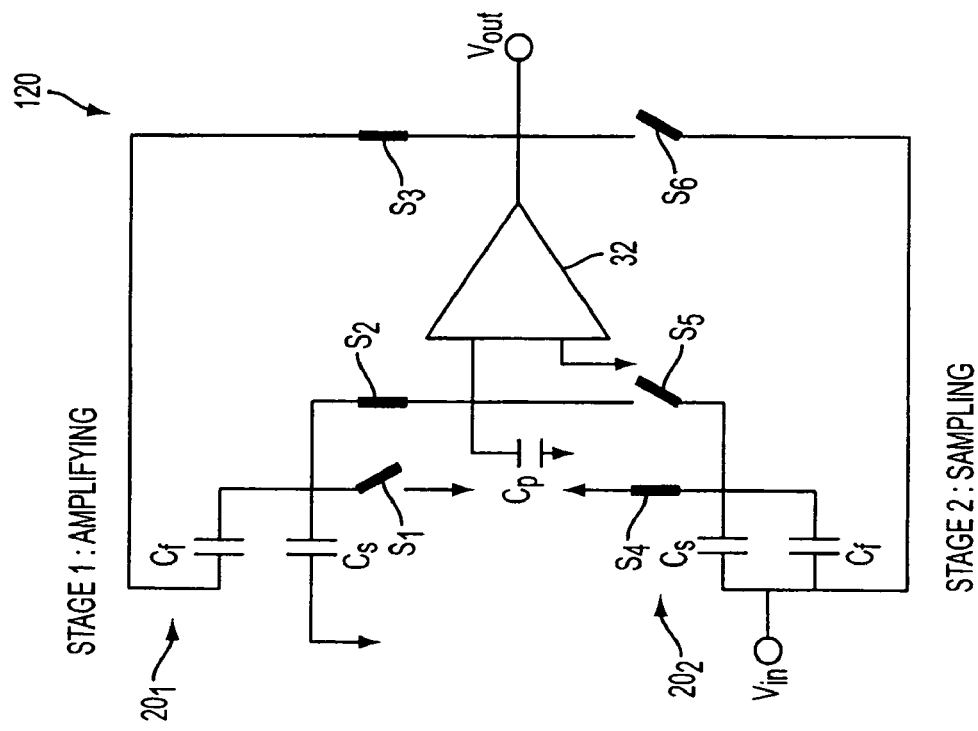
FIG. 6 illustrates a second shared operational amplifier configuration of the two stages of the FIG. 1 pipelined analog-to-digital converter in accordance with a second timing of the FIG. 2 timing diagram.
Figure 5:
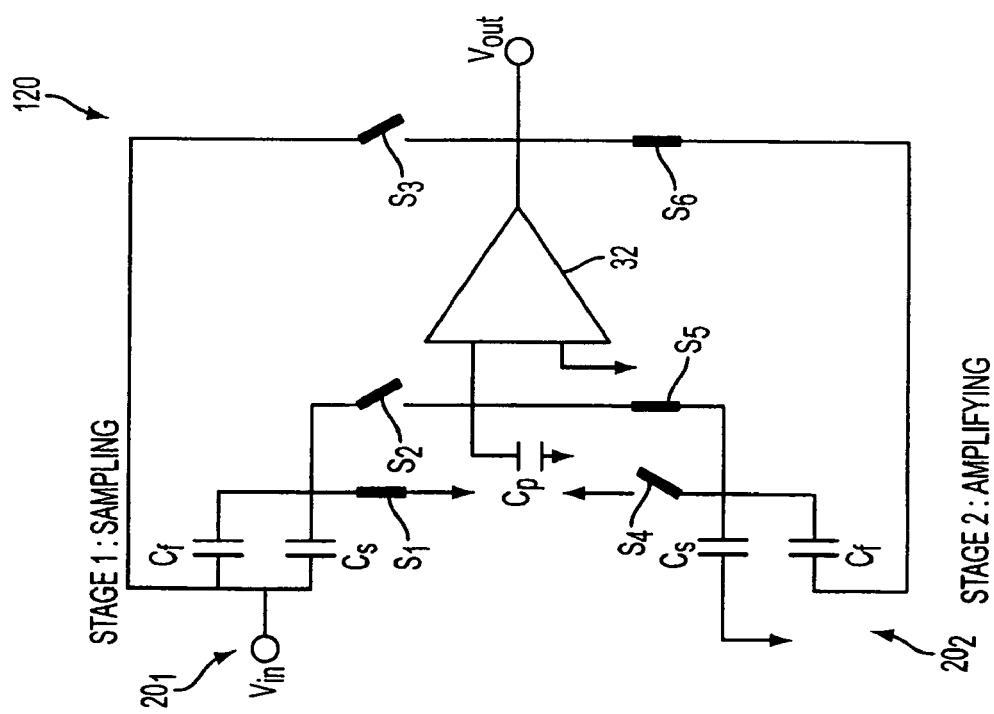
FIG. 5 illustrates a first shared operational amplifier configuration of the two stages of the FIG. 1 pipelined analog-to-digital converter in accordance with one timing of the FIG. 2 timing diagram.
Figure 7A:
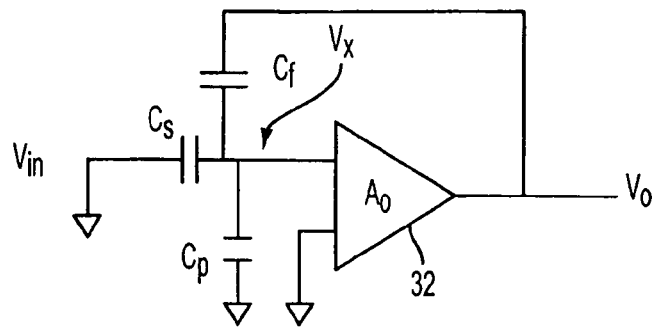
FIGS. 7a and 7b illustrate by comparison the memory effect that arises in the shared operational amplifier configuration of the two stages of the FIG. 1 pipelined analog-to-digital converter.
Figure 7B:
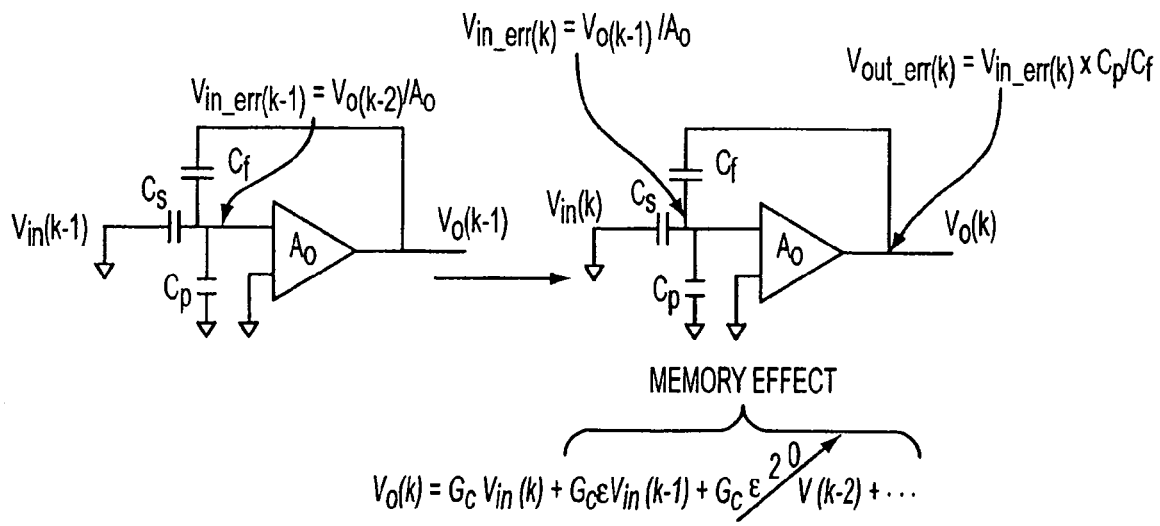
Figure 7C:
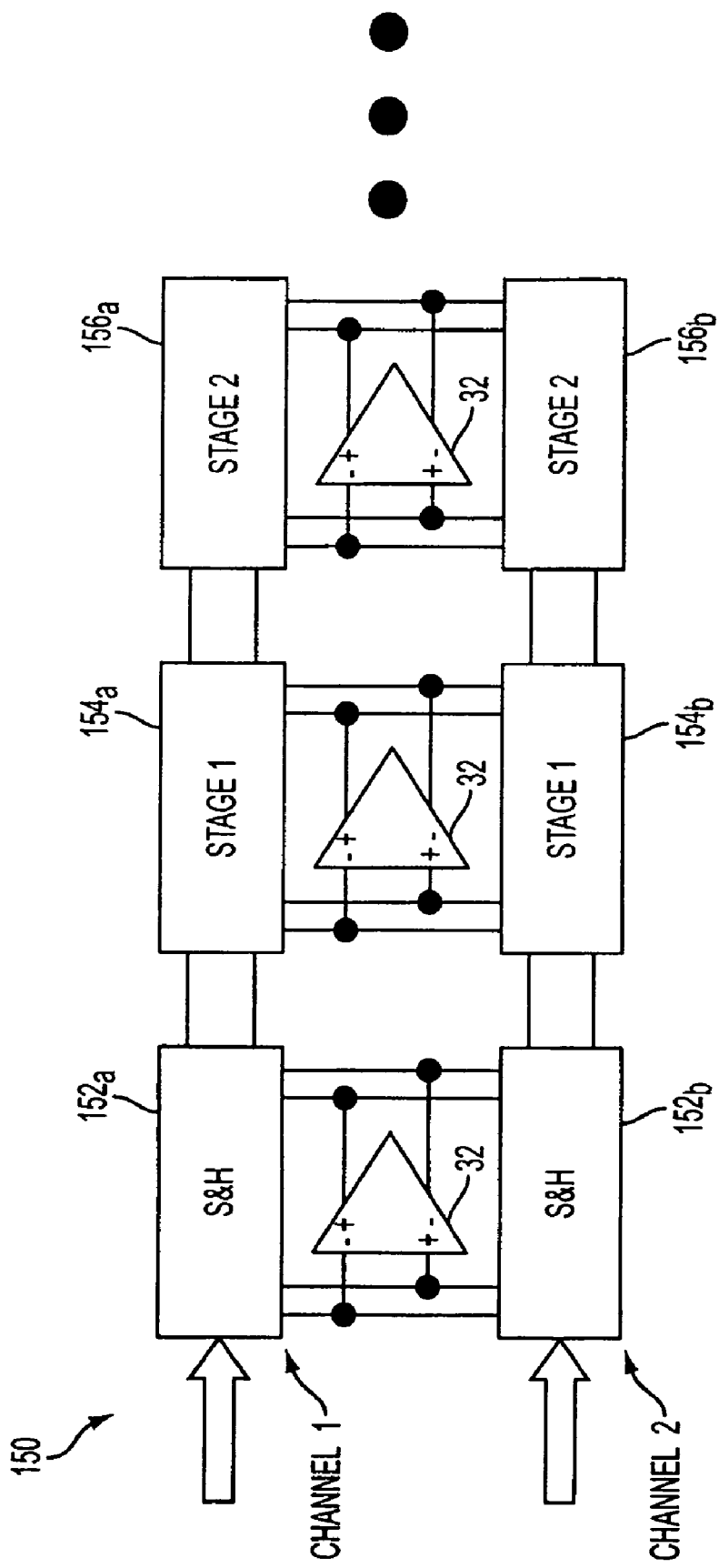
FIG. 7c illustrates a two channel signal processing circuit that shares operational amplifiers between respective portions of the channels.
Figure 8:
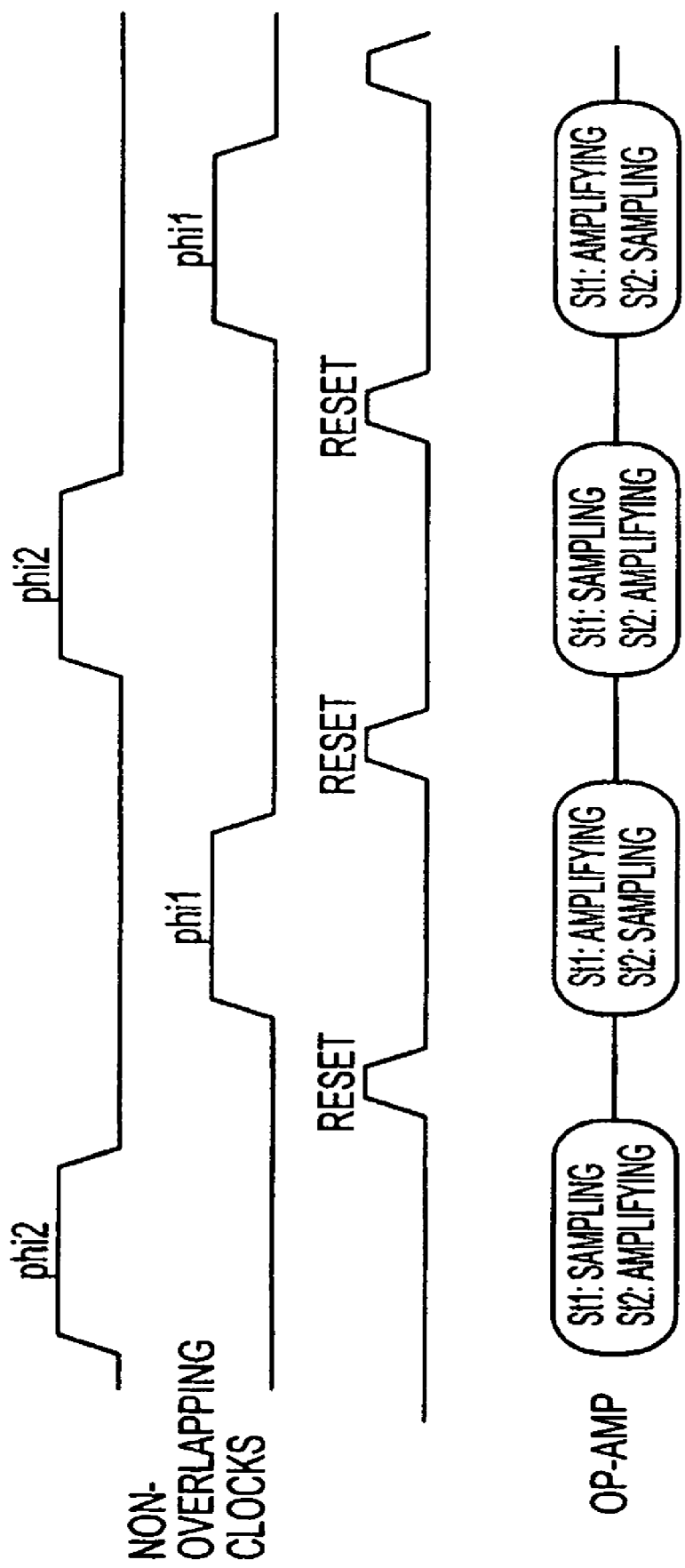
FIG. 8 is an exemplary timing diagram for two stages of pipelined analog-to-digital converter constructed in accordance with an exemplary embodiment of the invention.
Figure 10:
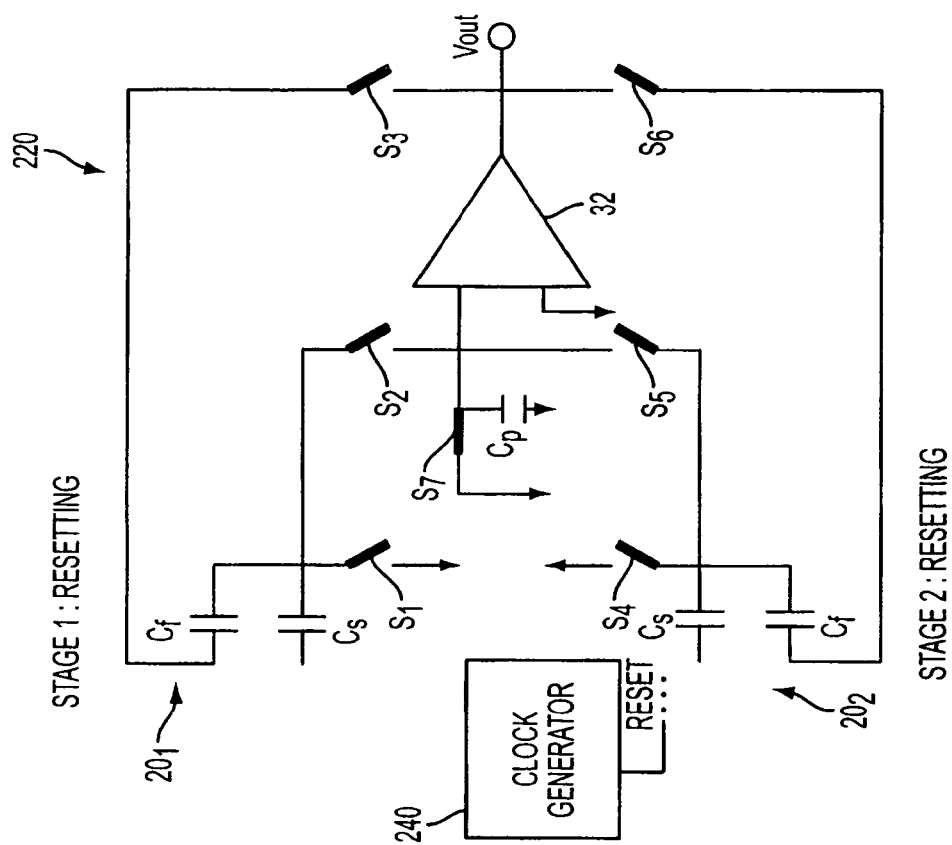
FIG. 10 illustrates a second shared operational amplifier configuration of two stages of the pipelined analog-to-digital converter constructed in accordance with an exemplary embodiment of the invention in accordance with a second timing of the FIG. 8 timing diagram.
Figure 9:
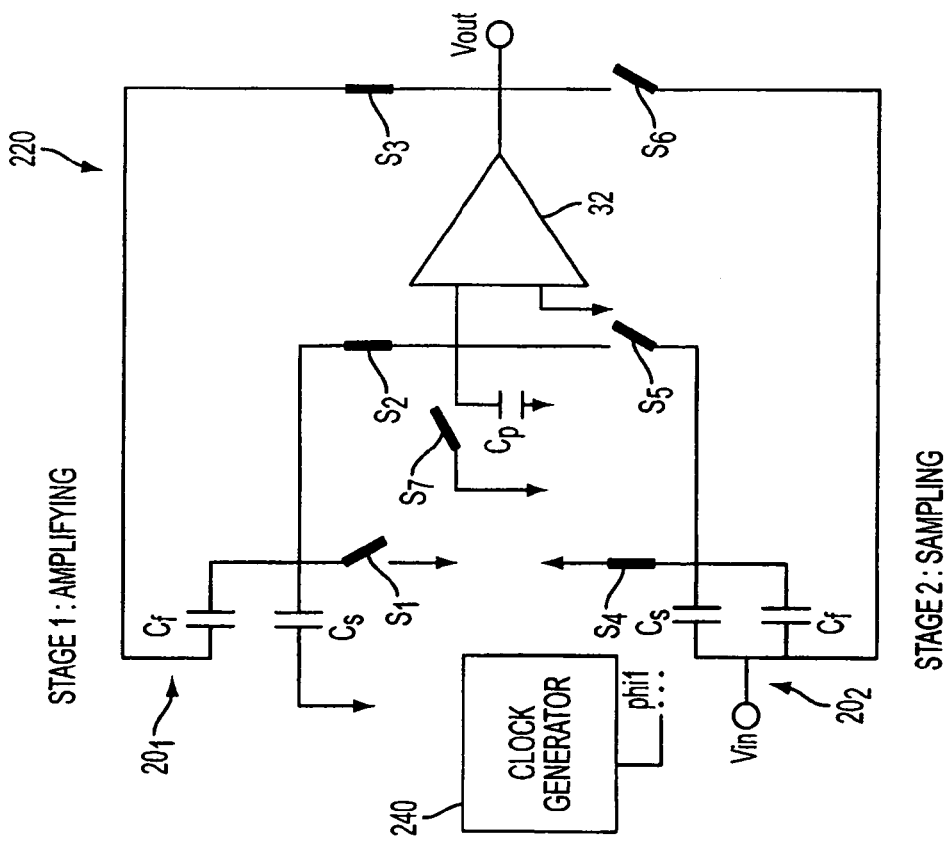
FIG. 9 illustrates a first shared operational amplifier configuration of two stages of the pipelined analog-to-digital converter constructed in accordance with an exemplary embodiment of the invention in accordance with one timing of the FIG. 8 timing diagram.
Figure 11:
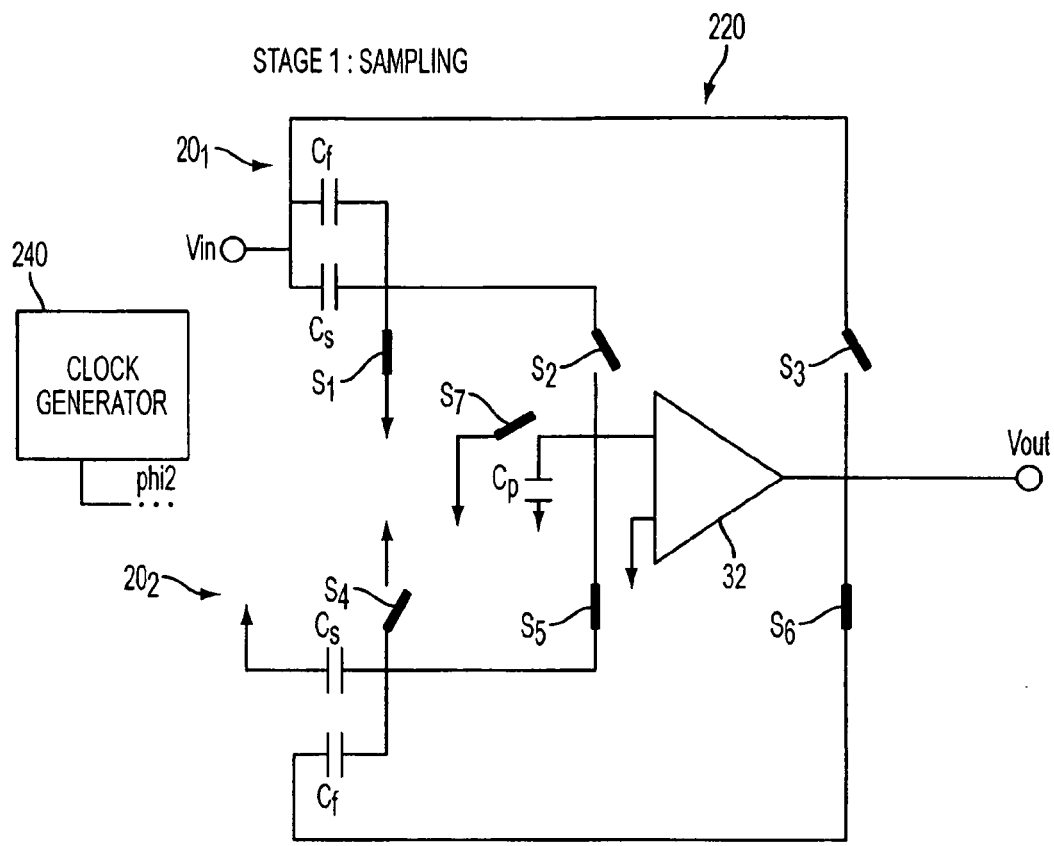
FIG. 11 illustrates a third shared operational amplifier configuration of two stages of the pipelined analog-to-digital converter constructed in accordance with an exemplary embodiment of the invention in accordance with a third timing of the FIG. 8 timing diagram.

FIG. 8 is an exemplary timing diagram for two stages of pipelined analog-to-digital converter constructed in accordance with an exemplary embodiment of the invention. The construction of the pipelined analog-to-digital converter of the invention is similar to the analog-to-digital converter 10 illustrated in FIG. 1, but with the following notable exceptions. The pipelined analog-to-digital converter of the invention uses a shared operational amplifier circuit 220 (as shown in FIGS. 9-11). The circuit 220 differs from other shared operational amplifier circuits 120 (FIG. 5-6) because it includes a discharge switch S7 connected between an input of the operational amplifier 32-and a ground potential. As is described below, when the discharge switch S7 is closed (at the timing illustrated in FIG. 8), a discharge path from the operational amplifier 32 input to ground is created. This discharge path will discharge any parasitic capacitance seen at the operational amplifier 32 input, which substantially mitigates the memory effect and the problems associated with the memory effect.

As shown in FIG. 8, when the second clock signal PHI2 is asserted, the first stage STAGE 1 undergoes a sampling operation while the second stage undergoes an amplifying operation. When the first clock signal PHI1 is asserted, the first stage STAGE 1 undergoes an amplifying operation while the second stage undergoes a sampling operation. During the time after the first clock signal PHI1 transitions low, but before the second clock signal PHI2 transitions high, a short reset pulse RESET is asserted. The short reset pulse RESET is also asserted during the time after the second clock signal PHI2 transitions low, but before the first clock signal PHI1 transitions high. The assertion of the clock signals PHI1, PHI2 and the reset pulse RESET configures the circuit 220 as follows.

Referring to FIG. 9, a clock generator 240 generates the first clock signal PHI1. When the first clock signal PHI1 is asserted, switches S2, S3 and S4 are closed, while switches S1, S5, S6 and S7 are opened. This switch configuration allows the stage 1 arithmetic unit $20_1$ to amplify, using the operational amplifier 32, a signal stored in the stage 1 sampling capacitor Cs. Thus, the output Vout of the amplifier 32 and thus, circuit 220, is an amplified stage 1 signal. In addition, the switch configuration allows the stage 2 arithmetic unit $20_2$ to store an input analog signal Vin in the stage 2 sampling capacitor Cs.

FIG. 10 illustrates a reset/discharge operation of the circuit 220. As is shown in FIG. 8, a reset pulse RESET is generated during two time periods: (1) during the time after the first clock signal PHI1 transitions low, but before the second clock signal PHI2 transitions high; and (2) during the time after the second clock signal PH12 transitions low, but before the first clock signal PHI1 transitions high. Referring to FIG. 10, the clock generator 240 generates the reset/discharge pulse at the appropriate timing. Since both the first and second clock signals PHI1, PHI2 are low (i.e., not asserted), switches S1-S6 are opened. Due to the reset pulse RESET, switch S7 is closed. The closure of switch S7 forms a discharge path from the first input of the operational amplifier 32 to a ground potential. This discharge path allows any parasitic capacitance Cp present at the first input of the amplifier 32 to be discharged. Any subsequent sampling/amplification operations will not be adversely impacted by parasitic capacitance Cp, which means that the circuit 220 of the invention, and the pipelined analog-to-digital converter utilizing the circuit 220, will not suffer from the memory effect.

Referring to FIG. 11, the clock generator 240 generates the second clock signal PHI2. When the second clock signal PHI2 is asserted, switches S1, S5 and S6 are closed, while switches S2, S3, S4 and S7 are opened. This switch configuration allows the stage 1 arithmetic unit $20_1$ to store an input analog signal Vin in the stage 1 sampling capacitor Cs. In addition, the switch configuration allows the stage 2 arithmetic unit $20_2$ to amplify, using the operational amplifier 32, a signal stored in the stage 2 sampling capacitor Cs. Thus, the output Vout of the amplifier 32 and thus, circuit 220, is an amplified stage 2 signal.

It should be appreciated that the clock signals PHI1, PHI2 and the reset pulse RESET (FIG. 8) may be generated by the dock generator 240 or other device, which may be configured to, or controlled to, generate the clock signals PHI1, PHI2 and the reset pulse RESET at the timing illustrated in FIG. 8. The clock generation circuitry may be the same circuitry used in the conventional pipelined analog-to-digital converters, with the modification of generating the reset pulse RESET at the appropriate timing.

Figure 12:
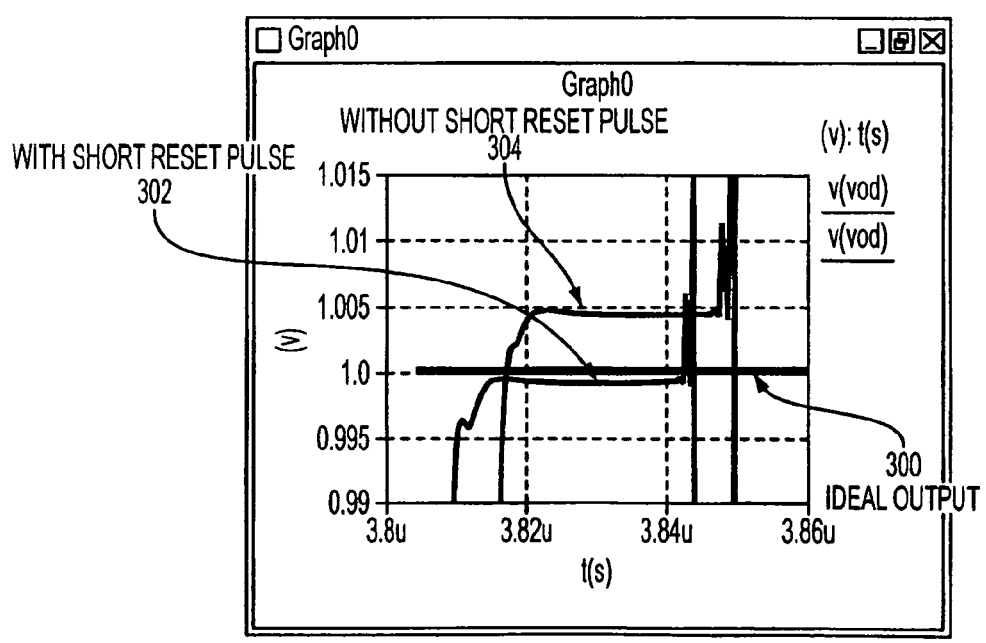
FIG. 12 illustrates comparative simulations of the conventional pipelined analog-to-digital converter and the pipelined analog-to-digital converter constructed in accordance with an exemplary embodiment of the invention.

FIG. 12 illustrates comparative simulations of the conventional pipelined analog-to-digital converter and the pipelined analog-to-digital converter constructed in accordance with an exemplary embodiment of the invention. In FIG. 12, line 300 represents the ideal amplifier 32 output. Curve 302 represents the simulated amplifier output, when the reset/discharging technique of the invention is used. That is, curve 302 represents the outputs achieved when the short reset pulse is applied in the time periods before the clock signals PHI1, PHI2 switch the shared configuration of the circuit 220. Curve 302 indicates that the output is substantially at the level of the ideal output 300. By contrast, curve 304 represents the simulated amplifier output when the reset/discharging technique of the invention is not used. That is, curve 304 represents the prior art switching used in the shared configuration of circuit 120. Curve 304 indicates that the output is substantially above the level the ideal output 300. This is due to the memory effect described above. Accordingly, the present invention is a vast improvement of today's conventional pipelined analog-to-digital converters that share amplifiers among pipeline stages.

One of the advantages of using the short reset pulse RESET (FIG. 8) to discharge any parasitic capacitance at the operational amplifier 32 input includes reducing the residual error associated with the parasitic capacitance, especially when the analog-to-digital converter is over-driven. Another advantage includes reducing the worst case slewing time of the circuit 220. With the invention, the maximum output swing of the operational amplifier 32 is a reference voltage Vref. Without the reset/discharge feature of the invention, the worst case output swing of the operational amplifier could be at least twice the reference voltage Vref.

Figures 13A, 13B:
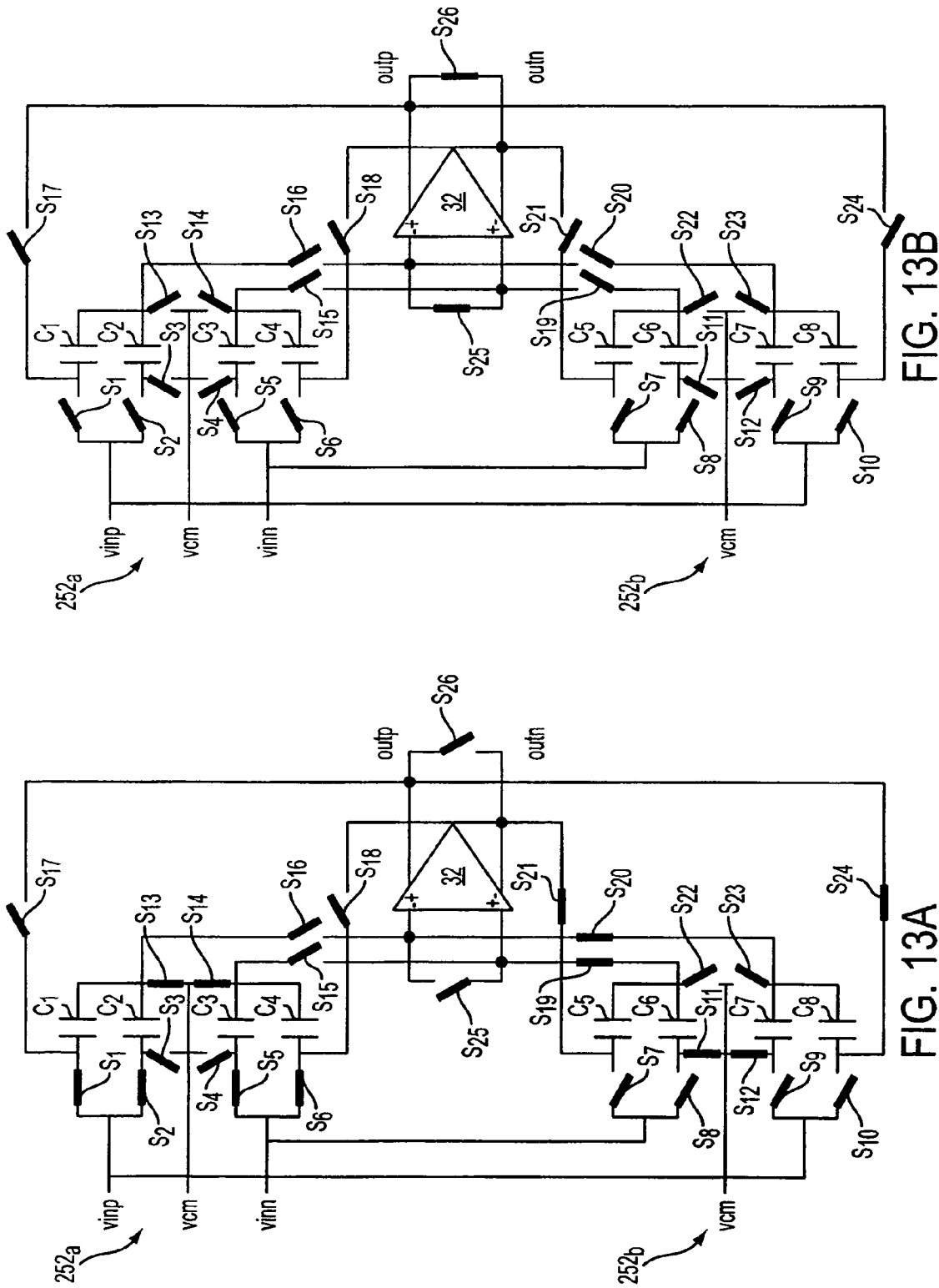
FIGS. 13a-c illustrate a portion of a two-channel signal processing circuit that shares operational amplifiers between respective portions of the channels constructed in accordance with an exemplary embodiment of the invention.
Figure 13C:
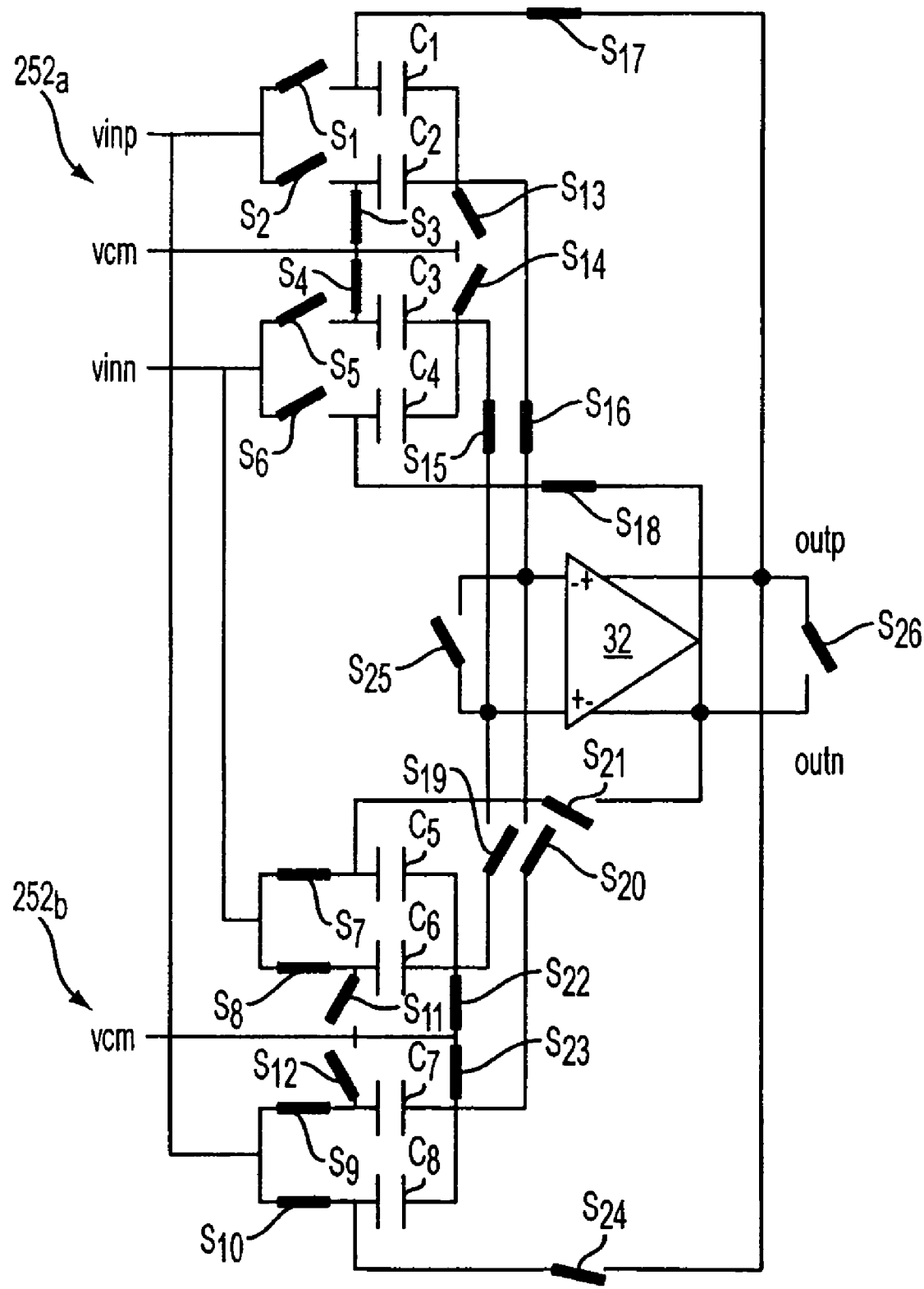

FIGS. 13a-c illustrate a portion of a two-channel signal processing circuit 250 that shares operational amplifiers 32 between respective portions of the channels $252_a$, $252_b$ constructed in accordance with an exemplary embodiment of the invention. That is, the circuit 250 utilizes the short reset pulse to discharge any capacitance seen at the shared operational amplifier 32. The first channel $252_a$ comprises four capacitors C1, C2, C3, C4 and switches S1, S2, S3, S4, S5, S6, S13, S14, S15, S16, S17, S18. The second channel 252b comprises four capacitors C5, C6, C7, C8 and switches S7, S8, S9, S10, S11, S12, S19, S20, S21, S22, S23, S24. Between the two channels $252_a$, $252_b$, is an operational amplifier 32 and two discharge switches S25, S26. The circuitry operates at the timing illustrated in FIG. 8.

FIG. 13a illustrates the configuration for the two channels $252_a$, $252_b$ when the first clock signal PHI1 is asserted. When the first clock signal PHI1 is asserted, switches S1, S2, S5, S6, S13 and S14 are closed in the first channel $252_a$ while switches S11, S12, S19 and S20 are closed in the second channel $252_b$. This connects the first channel $252_a$ to receive differential input signals Vinp, Vinn. The second channel $252_b$ amplifies signals previously stored in capacitors C5-C8. Vcm is a common mode voltage used to place charge on (or read charge out o f the capacitors C1-C8.

FIG. 13b illustrates the configuration for the two channels $252_a$, $252_b$ when the reset pulse RESET is asserted. That is, FIG. 13b illustrates the discharge operation. When the reset pulse RESET is asserted, only switches S25 and S26 are closed. Since both the first and second clock signals PHI1, PHI2 are low (i.e., not asserted), switches S1-S24 are opened. The closure of switch S25 forms a discharge path between the inputs of the operational amplifier 32. This discharge path allows any parasitic capacitance present at the amplifier 32 to be discharged. Any subsequent sampling/amplification operations will not be adversely impacted by parasitic capacitance, which means that the two channels $252_a$, $252_b$ will not suffer from the memory effect. FIG. 13b illustrates the closure of output switch S26 during the discharge operation, which may help mitigate the memory effect at the amplifier 32 outputs. It should be appreciated, however, that switch S26 (and the closure of switch 26) is not required to practice the invention.

FIG. 13c illustrates the configuration for the two channels $252_a$, $252_b$ when the second clock signal PHI2 is asserted. When the second clock signal PHI2 is asserted, switches S15, S16, S17 and S18 are closed in the first channel $252_a$ while switches S7, S8, S9, S10, S22 and S23 are closed in the second channel $252_b$. This connects the second channel $252_b$ to receive differential input signals Vinp, Vinn. The first channel $252_a$ amplifies signals previously stored in capacitors C1-C4.

Figure 14:
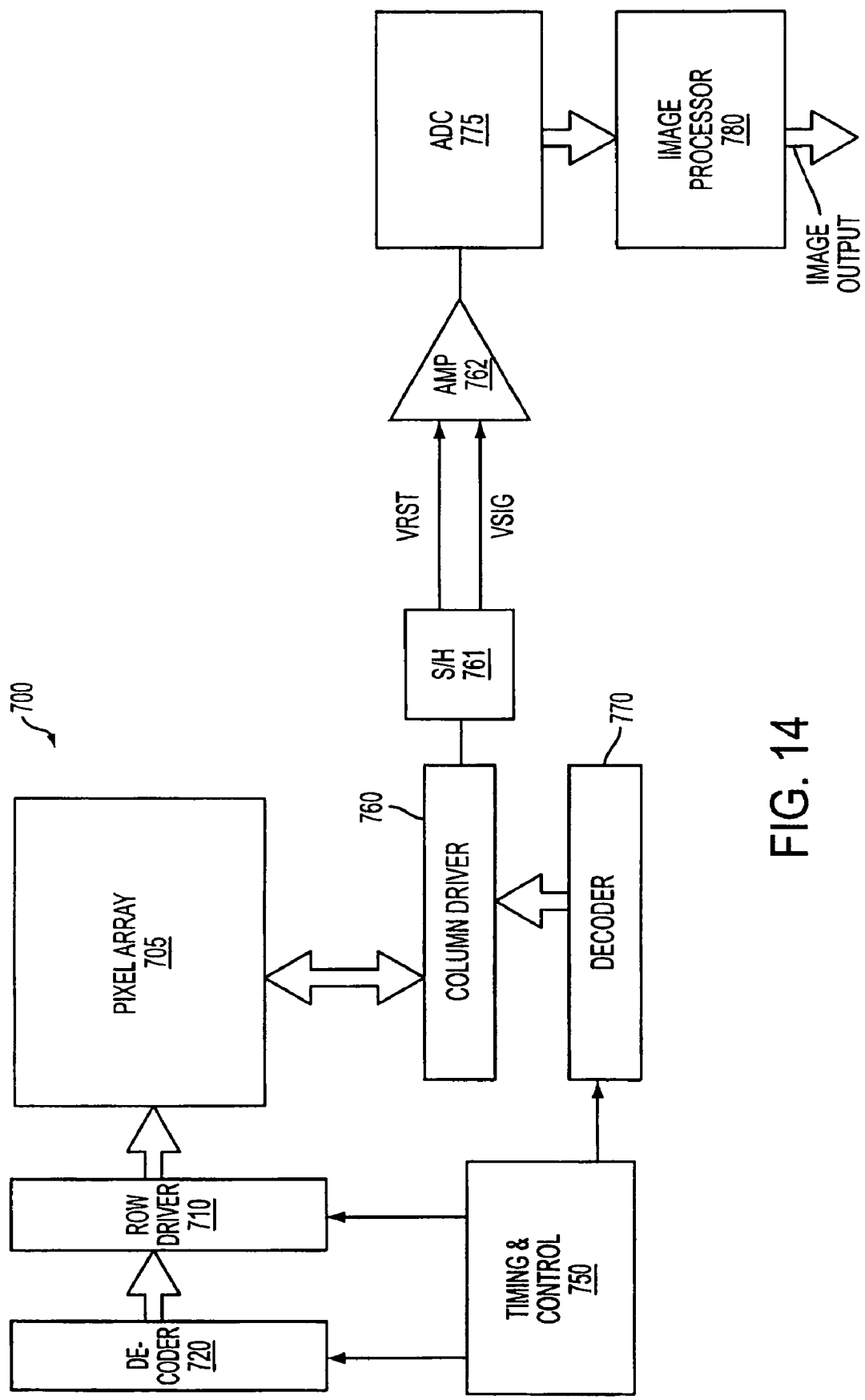
FIG. 14 is a block diagram of a CMOS imager, which utilizes either the pipelined analog-to-digital converter or the shared channel processing circuitry constructed in accordance with an exemplary embodiment of the invention.

FIG. 14 illustrates an exemplary imager 700 that may utilize the analog-to-digital converter or shared channel processing circuitry constructed in accordance with the invention. The Imager 700 has a pixel array 705 comprising rows and columns of pixels. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760.

A sample and hold circuit 761 associated with the column driver 760 reads a pixel reset signal Vrst and a pixel image signal Vsig for selected pixels. A differential signal (Vrst–Vsig) is amplified by differential amplifier 762 for each pixel and is digitized by the pipelined analog-to-digital converter 775 of the invention. The analog-to-digital converter 775 supplies the digitized pixel signals to an image processor 780, which forms a digital image. Alternatively, the sample and hold circuit 761 and the analog-to-digital converter 775 may be connected in a shared two channel configuration such as the configuration illustrated in FIGS. 7c and 13a-13c. Each channel would be responsible for a different set of pixel signals (e.g., one channel can process red and blue pixel signals, while the other channel processes green pixel signals).

Figure 15:
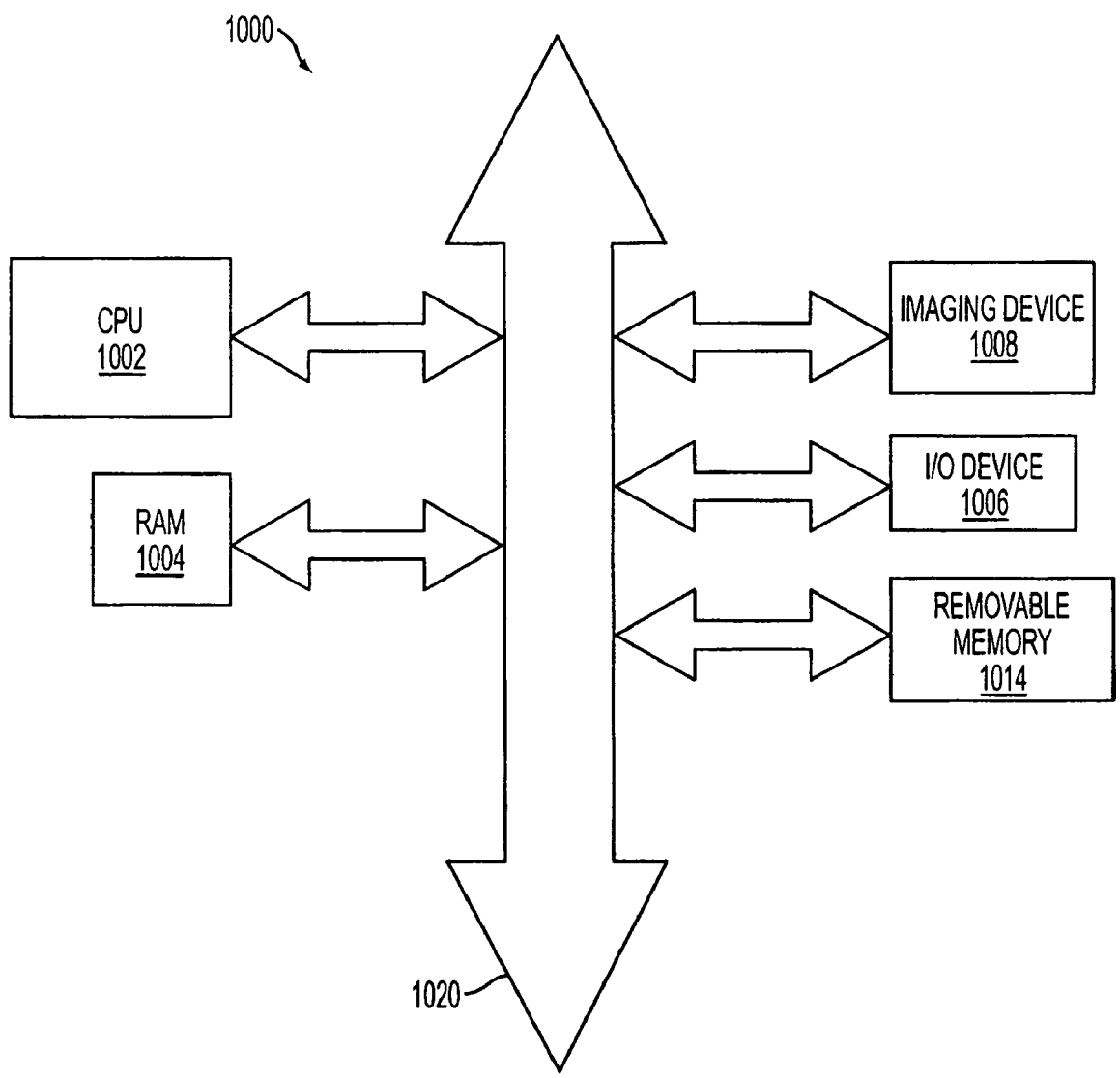
FIG. 15 is a block diagram of a processing system utilizing the imaging system illustrated in FIG. 14.

FIG. 15 shows a system 1000, a typical processor system modified to include an imaging device 1008 (such as the imaging device 700 illustrated in FIG. 14) of the invention. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM)1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A method of operating a pipelined analog-to-digital converter comprising first and second stages sharing an amplifier, said method comprises:
   performing a first discharge operation at the amplifier in response to a first reset pulse during a first period in which the first and second stages change operations, wherein the first period occurs after a first clock signal is used to cause the first stage to perform a first operation and the second stage to perform a second operation, but before a second clock signal is used to cause the first stage to perform the second operation and the second stage to perform the first operation; and
   performing a second discharge operation at the amplifier during a second period in which the first and second stages change operations,
   wherein the second period occurs after the second clock signal is used to cause the first stage to perform the second operation and the second stage to perform the first operation.

2. An imager comprising:
   a pixel array;
   sample and hold circuitry coupled to receive analog signals from pixels within the array;
   an amplification circuit for amplifying the analog signals; and
   a pipelined analog-to-digital converter connected to receive and convert the amplified analog signals to digital signals, said converter comprising:
   first and second pipeline stages and a discharge circuit, the first and second pipeline stages are adapted to be switchably connected to an amplifier in response to first and second clock signals, the discharge circuit causing a discharge operation to occur at an input of the amplifier in response to a reset pulse during a first period after the first clock signal, but before the second clock signal, in which the connections between the first and second pipeline stages and the amplifier switch, the discharge circuit causing another discharge operation to occur at the input of the amplifier in response to another reset pulse during a second period after the second clock signal, but before the first clock signal, in which the connections between the first and second pipeline stages and the amplifier switch.

3. The imager of claim 2, wherein said discharge operation forms a parasitic capacitance discharge path from the input of the amplifier to a discharge area.

4. The imager of claim 2, wherein said discharge circuit comprises a switch coupled between a ground potential and the input the amplifier, wherein the switch is adapted to receive the reset pulse between the first and second clock signals and connect the input of the amplifier to the ground potential in response to the reset pulse.

5. The imager of claim 2, wherein the analog-to-digital converter further comprises a clock generator, said clock generator generating non-overlapping first and second clock signals and a plurality of reset pulses, said clock generator applying the first and second clock signals and the reset pulses to the pipeline stages and the discharge circuit to change the connections between the pipeline stages, discharge circuit and the amplifier.

6. The imager of claim 5, wherein said first clock signal causes said first stage to have a first connection to the amplifier and to perform a first operation and said second stage to have a second connection to the amplifier and to perform a second operation.

7. The imager of claim 6, wherein said second clock signal causes said first stage to have the second connection to the amplifier and to perform the second operation and said second stage to have the first connection to the amplifier and to perform the first operation.

8. The imager of claim 5, wherein said reset pulses cause the discharge circuit to have a connection between a discharge path and the input of the amplifier and to perform the discharge operation.

9. The imager of claim 5, wherein the reset pulses are generated after the first clock signal transitions from a first state to a second state and after the second clock signal transitions from the first state to the second state.

10. An imager comprising:
    a pixel array;
    a first signal processing channel coupled to receive first analog signals from pixels within the array;
    a second signal processing channel coupled to receive second analog signals from pixels within the array;
    amplifier adapted to be switchably connected between the first and second channels; and
    a discharge circuit adapted to be switchably connected to an input of the amplifier, the discharge circuit causing a discharge operation to occur at an input of the amplifier during a period in which the connections between the first and second channels and the amplifier switch, the discharge circuit comprising a switch coupled between a ground potential and the input of the amplifier, wherein the switch is adapted to receive a reset pulse and connect the input of the amplifier to the ground potential in response to the reset pulse.

11. The imager of claim 10, wherein the discharge operation forms a parasitic capacitance discharge path from the input of the amplifier to a discharge area.

12. The imager of claim 10, wherein the analog-to-digital converter further comprises a clock generator, said clock generator generating non-overlapping first and second clock signals and a plurality of reset pulses, said clock generator applying the first and second clock signals and the reset pulses to the channels and the discharge circuit to change the connections between the channels, discharge circuit and the amplifier.

13. The imager of claim 12, wherein said first clock signal causes said first channel to have a first connection to the amplifier and to perform a first operation and said second channel to have a second connection to the amplifier and to perform a second operation.

14. The imager of claim 13, wherein said second clock signal causes said first channel to have the second connection to the amplifier and to perform the second operation and said second channel to have the first connection to the amplifier and to perform the first operation.

15. The imager of claim 12, wherein said reset pulses cause the discharge circuit to have a connection between a discharge path and the input of the amplifier and to perform the discharge operation.

16. The imager of claim 12, wherein the reset pulses are generated after the first clock signal transitions from a first state to a second state and after the second clock signal transitions from the first state to the second state.

* * * * *

UNITED STATES PATENT AND TRADEMARK OFFICE
CERTIFICATE OF CORRECTION

PATENT NO.         : 7,471,228 B2                                                    Page 1 of 1
APPLICATION NO.    : 11/604901
DATED              : December 30, 2008
INVENTOR(S)        : Cho et al.

It is certified that error appears in the above-identified patent and that said Letters Patent is hereby corrected as shown below:

In column 10, line 27, in Claim 10, before "amplifier" insert -- an --.

Signed and Sealed this

Twenty-fourth Day of March, 2009

JOHN DOLL
*Acting Director of the United States Patent and Trademark Office*